United States Patent [19]
Hiruma et al.

[11] Patent Number: 5,721,619
[45] Date of Patent: Feb. 24, 1998

[54] MISREGISTRATION DETECTING MARKS FOR PATTERN FORMED ON SEMICONDUCTOR SUBSTRATE

[75] Inventors: Takami Hiruma; Norifumi Sato, both of Tokyo, Japan

[73] Assignee: NEC Corporation, Tokyo, Japan

[21] Appl. No.: 767,846

[22] Filed: Dec. 17, 1996

[30] Foreign Application Priority Data

Dec. 18, 1995 [JP] Japan .................. 7-329311

[51] Int. Cl.$^6$ .................................. G01B 11/00
[52] U.S. Cl. .................. 356/401; 250/548; 430/22
[58] Field of Search ........................ 356/400, 401, 356/363; 437/974; 430/22; 250/548

[56] References Cited

U.S. PATENT DOCUMENTS

| | | | |
|---|---|---|---|
| 4,251,160 | 2/1981 | Bouwhuis et al. | 356/401 |
| 4,669,866 | 6/1987 | Phillips | 356/401 |
| 5,407,763 | 4/1995 | Pai | 430/22 |
| 5,528,372 | 6/1996 | Kawashima | 356/401 |
| 5,596,413 | 1/1997 | Stanton et al. | 356/401 |

*Primary Examiner*—Frank G. Font
*Assistant Examiner*—Robert Kim
*Attorney, Agent, or Firm*—Sughrue, Mion, Zinn, Macpeak & Seas, PLLC

[57] ABSTRACT

A semiconductor device according to the present invention has misregistration detecting marks provided in the periphery of a semiconductor chip. The misregistration detecting marks consist of a first scale mark for detecting misalignment in a first direction, a second scale mark for detecting misalignment in a second direction perpendicular to the first direction, and a third scale mark for detecting misalignment in a third direction making respectively specified angles with the first direction and the second direction.

10 Claims, 6 Drawing Sheets

MISREGISTRATION DETECTING MARKS FOR PATTERN FORMED ON SEMICONDUCTOR SUBSTRATE

BACKGROUND OF THE INVENTION

1. Field of the Invention

The present invention relates to a semiconductor device, and more particularly to misregistration detecting marks for detecting the amounts of misregistration of a pattern formed on a semiconductor substrate in manufacturing processes of the semiconductor device.

2. Description of the Prior Art

In the manufacturing processes of a semiconductor device, formation of wirings, contact holes, ion implantation regions, or the like for a wafer takes place in respective photomask processes. In the manufacturing processes of this kind it is necessary to conduct a highly precise alignment of a pattern to be formed in a later process with patterns formed in the prior processes. Because of this, exposure is carried out while correcting misregistration for the wafer by forming alignment marks on the wafer in advance at the same time with the formation of a pattern in the preceding process and conducting alignment at the time of formation of a pattern in the succeeding process by utilizing the alignment marks in the preceding process.

However, during repeated exposures of short projection there will necessarily be found, with certain probability, insufficiently aligned units even for patterns formed with such a care. If the degree of the misregistration exceeds a tolerable range, the completed semiconductor chip has to be classified as a defective unit on the ground of, for example, electrical short-circuiting between the wiring layer and the contact hole. Because of this, it is necessary to conduct a misalignment inspection after development, and depending on the result, a wafer with detected misalignment of intolerable degree has to either go through removal of the photoresist and another photomask process or be taken out and discarded.

In order to readily carry out an inspection of misalignment in a photomask process by means of observation with an optical microscope, a technique of using the so-called calipers as misregistration detecting marks has been proposed. What is meant by calipers here is scale marks provided in one direction at a specified position on the wafer plane as shown in FIG. 1. Shown in FIG. 1 are X scale marks (referred to as X calipers hereinafter) 11 and Y scale marks (referred to as Y calipers hereinafter) 12 formed in the direction perpendicular to the X direction. Of the X calipers 11 and the Y calipers 12, 11A and 12A are first calipers formed in a succeeding process and 11B and 12B are second calipers formed previously in a preceding process. Both kinds of calipers have slightly different pitches for their scale marks where they are normally configured such that the pitch of the first calipers 11A and 12A is somewhat larger than the pitch of the second calipers 11B and 12B.

The second calipers 11B and 12B are formed by subjecting a substrate to an etching process using a photoresist exposed in the shape of the calipers. In the next process, an analogous photomask process is implemented to form the first calipers 11A and 12A superposed on the second calipers 11B and 12B formed in the preceding process.

FIG. 1 illustrates the condition with absolutely no misalignment in which the central scale mark of each of the second calipers 11B and 12B is situated substantially at the center of the central scale mark of each of the first calipers 11A and 12B. When there is a misalignment, it is represented by a condition in which a scale mark other than the central scale mark of each of the second calipers 11B and 12B is situated almost at the center of a scale mark other than the central scale mark of each of the first calipers 11A and 12A. Accordingly, it is possible to measure the amount of misalignment by detecting, with the optical microscope, which scale mark of each of the second calipers 11B and 12B is at the center of which scale mark of each of the first calipers 11A and 12A by taking the pitch sizes of respective kinds of calipers into account.

The conventional misalignment detection method using the X calipers and Y calipers has a problem in that it is difficult to make a highly precise measurement of the misregistration amount for a direction making specified angles with the X and Y directions (referred to as $\theta$ direction hereinafter) through observation of the alignment using the optical microscope, although it is possible to detect misalignment in each of the X and Y directions. For example, consider the case of a semiconductor static memory circuit for which a strict alignment in the $\theta$ direction is required as shown in FIG. 2(a). In the figure, a word line WL, a contact hole CH for taking out a bit signal and a gate electrode G of a driving transistor are arranged with respective spacings d11, d12 and d13, where d11 and d12 are designed to have an equal length. Since the word line WL, gate electrode G and contact hole CH are formed in respectively different photomask processes, errors will be generated among the spacings if a misalignment in the $\theta$ direction occurs. When the amount of the misalignment is sufficiently large, mutual electrical short-circuiting arises, and the memory circuit is classified as a defective unit. Similarly, FIG. 2(b) illustrates the example of a power supply wiring BL and contact holes CH1 and CH2 of storage nodes, in which an electrical short-circuiting may occur among the components if deviations arise in the spacings d21 and d22 owing to a misalignment in the $\theta$ direction.

The measurement of misalignment in the $\theta$ direction may also be accomplished using the X calipers and the Y calipers shown in FIG. 1. For example, in the case of measuring the misalignment in the direction making an angle of 45° with both of the X direction and the Y direction, if it is assumed that the amount of the misalignment is 0.1 µm for both of the X and Y directions, the amount of the misalignment for the direction with inclination of 45° is equal to 0.1 µm× $\sqrt{2}$=0.14 µm. In the case of the misalignment amount for a direction other than the $\theta$ direction with the inclination of 45°, its absolute value can be evaluated from the same principle as the square root of the sum of the squares of respective measured values of the deviation of the X direction and the Y direction.

However, this method requires the measurement of the misalignment amounts for the X and Y directions, as well as computations using these values, which causes an increase in the inspection time for the misalignment and brings about inconveniences for the mass production of the semiconductor device. For example, suppose in the above example that the limits of the misalignments are set at ±0.1 µm and the control limits of the X calipers and the Y calipers are set respectively at ±0.1 µm accordingly. Then, if the misalignment is judged by individually utilizing respective misalignment amounts for the X direction and the Y direction, it is not possible to immediately judge by the observation through a microscope the case where the misalignment in the $\theta$ (45°) direction is 0.14 µm which falls outside of ±0.1 µm, and one has to resort to the computations for making the required judgment which increases the inspection time.

BRIEF SUMMARY OF THE INVENTION

Object of the Invention

It is therefore the object of the present invention to provide a semiconductor device having marks for misregistration which makes it possible to take a highly precise and quick measurement of the misalignment in the X direction and the Y direction as well as the misalignment in the θ direction.

Summary of the Invention

The semiconductor device according to this invention has misregistration detecting marks provided in the periphery of the semiconductor chip. The misregistration detecting marks are constituted by including a first scale mark for detecting the misregistration in a first direction, a second scale marks for detecting misregistration in a second direction perpendicular to the first direction, and a third scale mark for detecting misregistration in a third direction making specific angles respectively with the first direction and the second direction.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
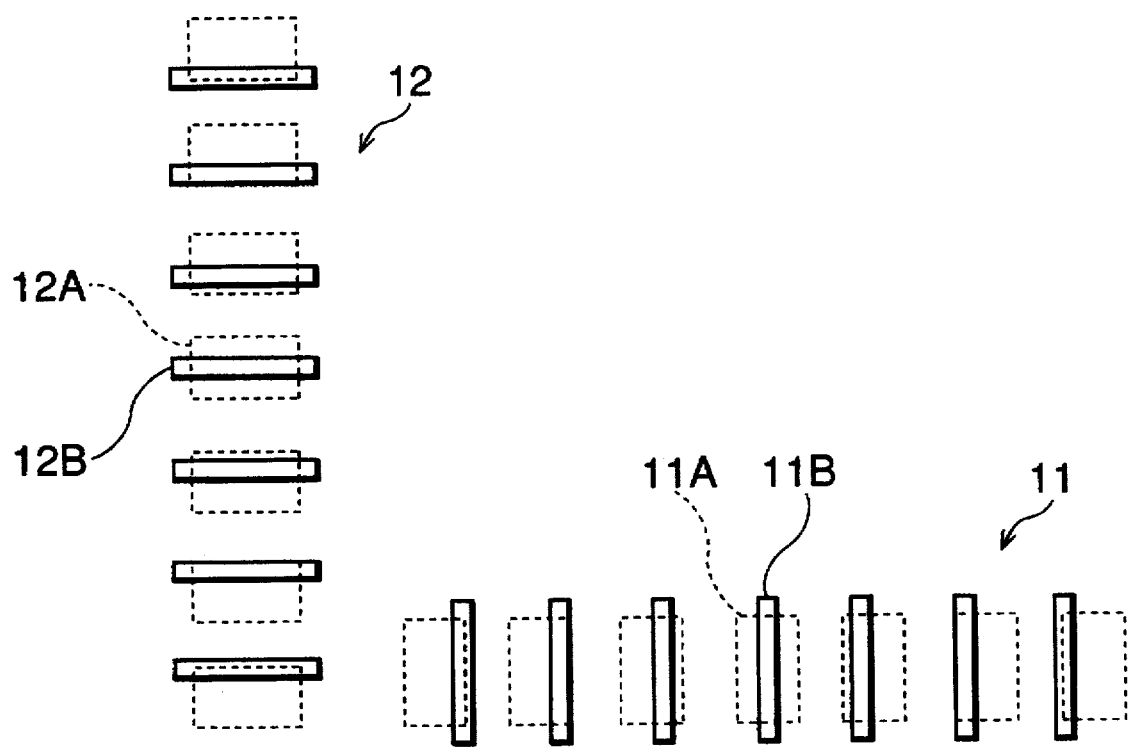
FIG. 1 is a diagram showing a conventional pattern of misregistration detecting marks.
Figure 2A:
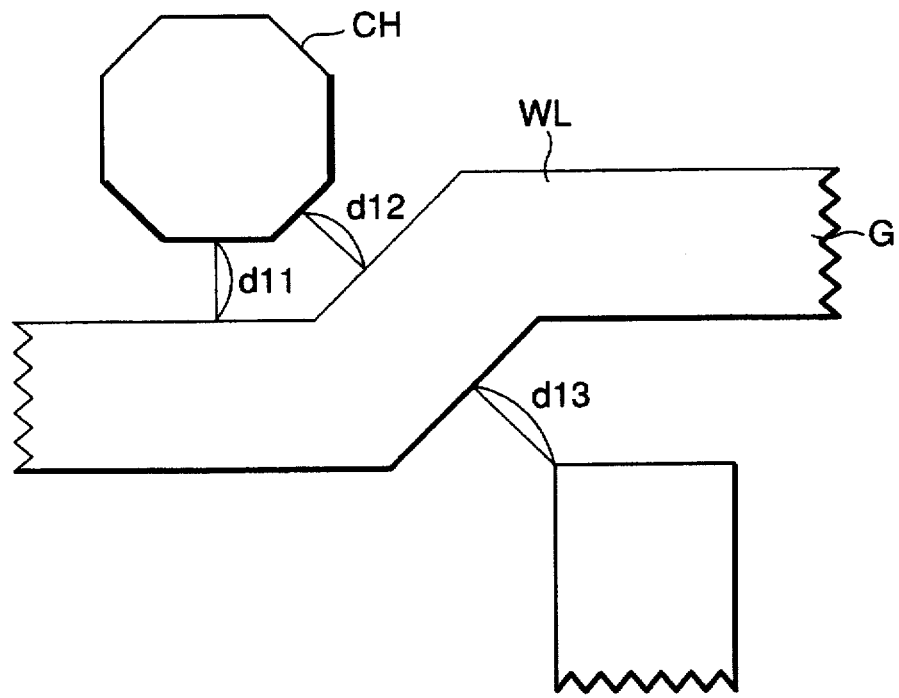
FIGS. 2(a) and 2(b) are diagrams showing wiring patterns for describing the problems in the conventional techniques.
Figure 2B:
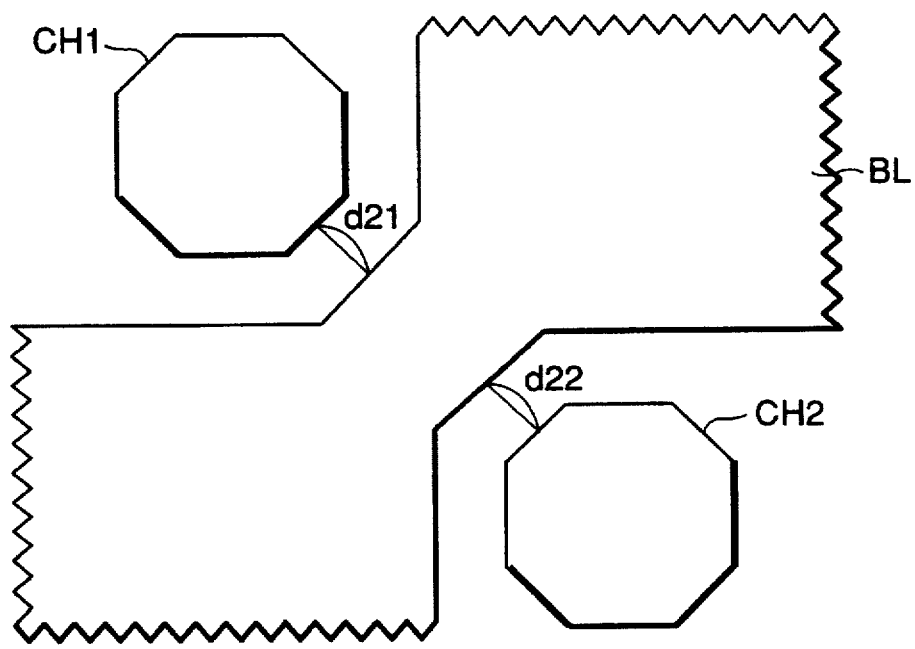
Figure 3:
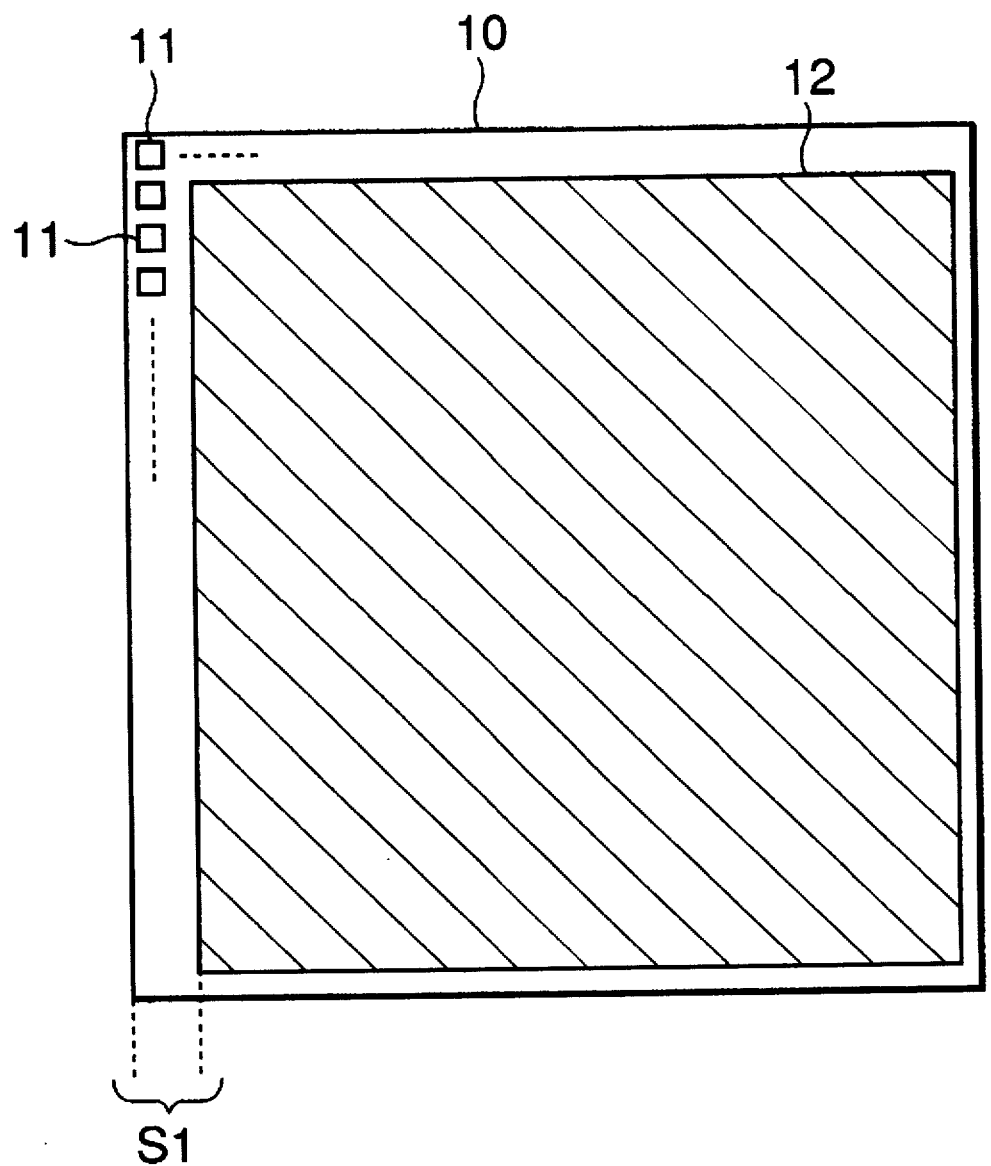
FIG. 3 is a diagram showing the arrangement on a chip of the misregistration detecting marks according to this invention.

Referring to FIG. 3, the arrangement of the misregistration detecting marks on a chip according to this invention will be described. A plurality of misregistration detecting marks 11 are formed in a peripheral part of a semiconductor chip 10. This peripheral part is a region electrically independent from a circuit formation region 12, which may be formed in, for example, a scribe region S1. One misregistration detecting mark 11 is formed corresponding to one photomask process. As will be described in detail later, one misregistration mark 11 is constituted of a plurality of scale marks. One misregistration detecting mark 11 is formed in an inspection region at a glance, in other words, in a region of the visual field of an optical microscope. Consequently, in the check of misalignment by the optical microscope there is no need for inspecting other parts of the chip.

Figure 4:
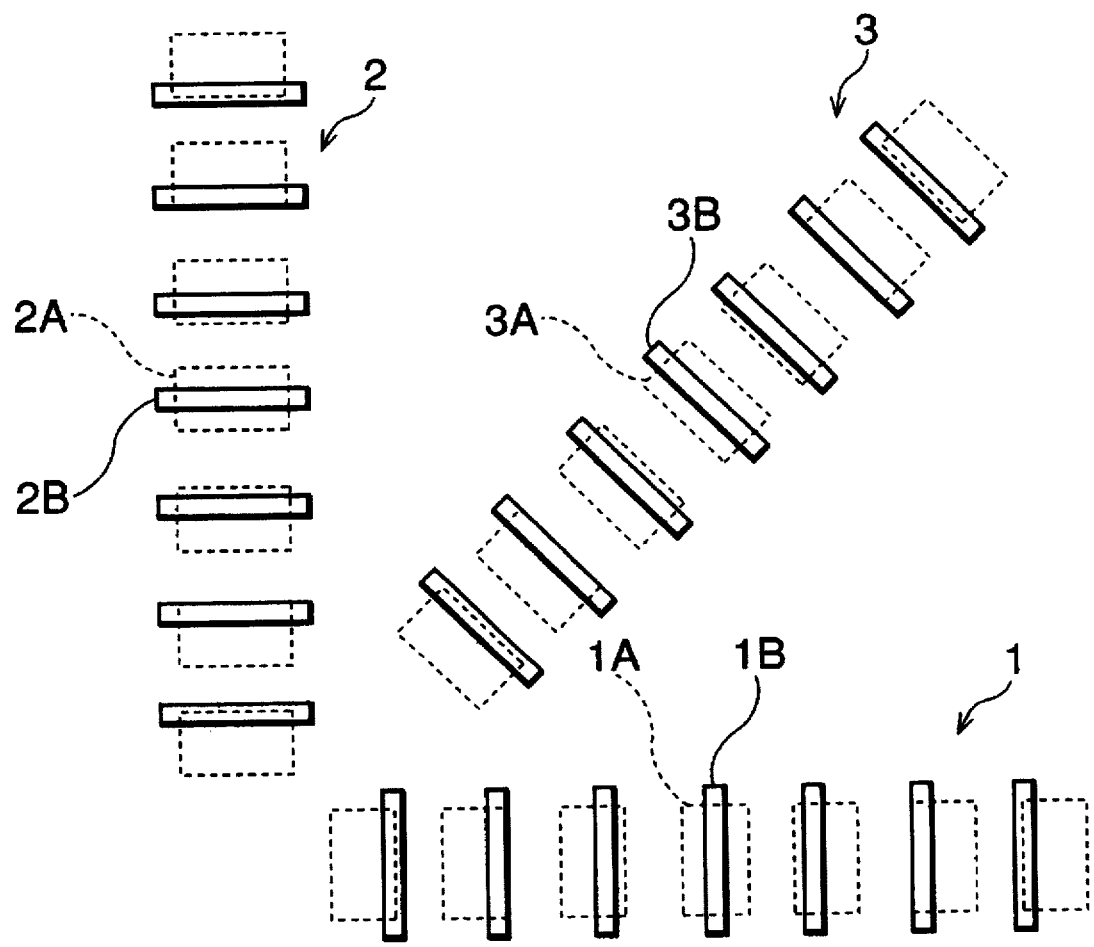
FIG. 4 is a diagram showing a first embodiment of the misregistration detecting marks according to this invention.

Referring to FIG. 4, a specific pattern of misregistration detecting marks according to this invention will be described. Each mark is constituted of first scale marks (X calipers 1) arrayed in X direction, second scale marks (Y calipers 2) arrayed in Y direction perpendicular to the X direction, and third scale marks (θ1 calipers 3) arrayed in θ1 direction making specific angles with the X and Y directions, both being 45° in this example. Each of first marks 1A, 2A and 3A constituting respective calipers 1, 2 and 3 is formed of a plurality of wide lines arrayed with intervals of a specific pitch. On the other hand, each of second marks 1B, 2B and 3B constituting respective calipers 1, 2 and 3 is formed of narrow lines equal in number to that of the first marks 1A, 2A and 3A, arrayed with intervals of a pitch somewhat smaller than that of the first marks. For example, the first marks 1A, 2A and 3A are formed with pitch interval of 1 µm, and the second marks 1B, 2B and 3B are formed with pitch interval of 0.95 µm.

The first marks 1A, 2A and 3A are formed on the wafer in a preceding photomask process, and the second marks 1B, 2B and 3B are formed on the wafer in a succeeding photomask process. By observing these marks with the optical microscope it is possible to carry out the check on the misalignment. For example, in the figure the central scale marks of respective second marks 1B, 2B and 3B are situated at respective centers of the center scale marks of the first mark 1A, 2A and 3A, indicating that no misalignment is taking place between the first and the second marks.

On the other hand, although not shown, when scale marks other than respective central marks of the second scale marks 1B, 2B and 3B are situated at respective centers of the central scale marks of the first marks 1A, 2A and 3A, it means that there are generated misalignments between the first and the second marks. The amounts of the misalignments can be measured in terms of the difference in the pitch sizes for both kinds of marks, namely, in the unit of 1−0.95=0.05 µm in this example. Consequently, the amounts of the misalignment between the two kinds of marks can be determined, by observing both kinds of marks and confirming the number of scale marks counted from the central scale mark of each mark where the centers of both kinds of marks are overlapped, based on the counted number of scale marks and the measurement unit of 0.05 µm. Since each mark consists of seven scale marks in this embodiment, misalignment within the range of 0.15 µm can be measured.

In this embodiment, not only the misalignment in the X direction between the two kinds of marks can be measured by the X calipers 1 and the misalignment in the Y direction can be measured by the Y calipers 2, the misalignment in the θ1 direction can be measured by the θ1 calipers. Since the misalignment in each direction can be measured in the unit of 0.05 µm by the calipers for each direction, it is possible to measure the misalignment between both kinds of marks, namely, the misalignment between the preceding photomask and the succeeding photomask for each of the X, Y and θ1 directions. In this way, it is possible to realize a highly precise alignment even in the manufacture of a semiconductor device for which a severe alignment precision in the θ1 direction is required. Accordingly, it is possible to reduce the design margin of the pattern in the θ1 direction which is advantageous for attaining high level of integration for the semi-conductor device. Moreover, the observation of the alignment for the θ1 direction by means of the optical microscope can be confirmed at a glance so that a quick alignment becomes possible.

Figure 5:
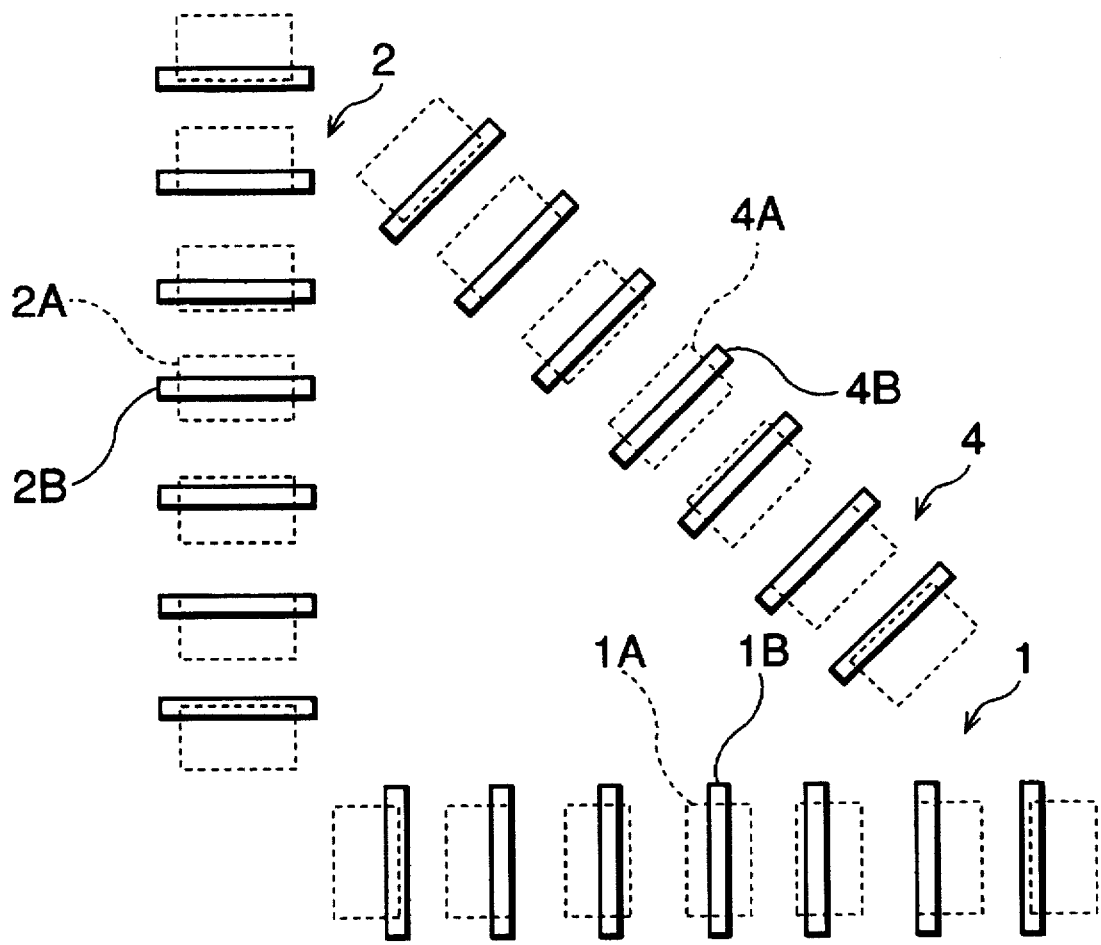
FIG. 5 is a diagram showing a second embodiment of the misregistration detecting marks according to this invention.

FIG. 5 is a diagram showing a second embodiment of this invention in which components equivalent to those in FIG. 4 are labeled with identical symbols. This embodiment is an example in which θ2 calipers 4 consisting of a first mark 4A and a second mark 4B are arrayed along θ2 direction which is inclined oppositely to the θ1 direction in FIG. 4. The configuration of this embodiment is the same as that of the first embodiment except that the θ2 direction differs from the θ1 direction in FIG. 4. Therefore, the misalignment in the θ2 direction can be measured quickly with a fine measurement unit analogous to the embodiment in FIG. 4, making a quick alignment operation possible.

Figure 6:
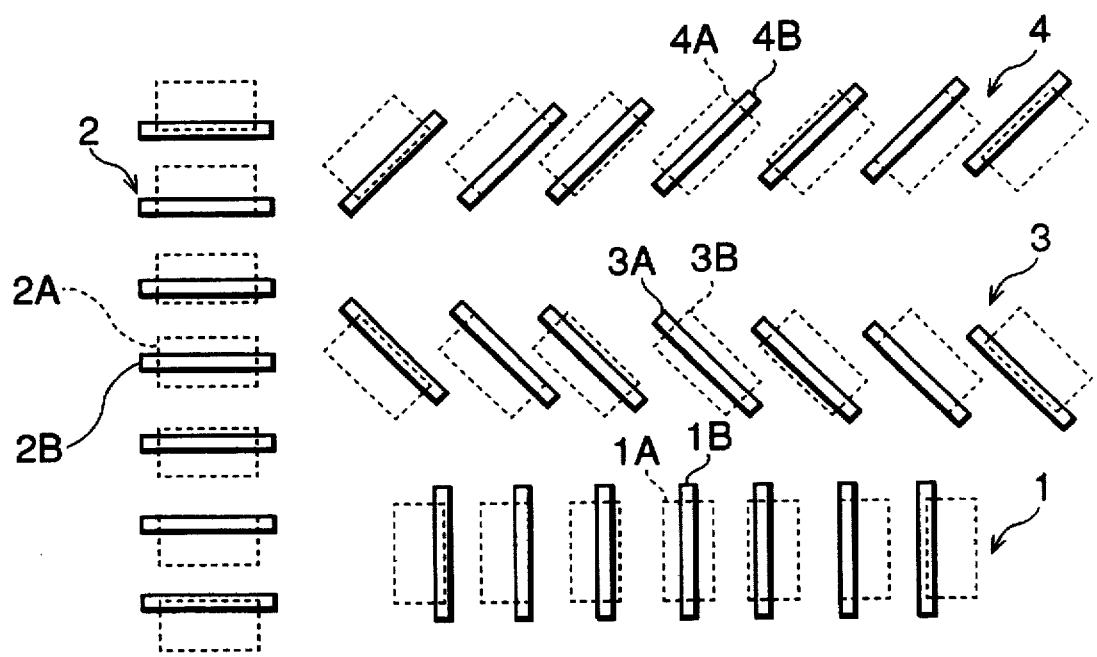
FIG. 6 is a diagram showing a third embodiment of the misregistration detecting marks according to this invention.

FIG. 6 is a diagram showing a third embodiment of this invention. It is configured such that the θ1 calipers 3 and the θ2 calipers 4 are arranged along with the X calipers 1 and the Y calipers 2 to enable in addition the simultaneous alignment in the mutually orthogonal θ1 direction and the θ2 direction.

In this embodiment, respective scale marks of the θ1 calipers 3 and the θ2 calipers 4 are obtained by translating the scale marks of respective calipers shown in FIG. 4 and FIG. 5 in the Y direction. Accordingly, scale marks inclined respectively in the θ1 direction and the θ2 direction are arranged in the X direction with respectively specified pitches of spacings. The method of misalignment detection of this embodiment is entirely analogous to the method for the first and second embodiments, and the misalignments in the θ1 direction and the θ2 direction can be measured in the same manner. Consequently, the respective misalignments in the X direction, Y direction, θ1 direction and θ2 direction can be measured quickly with high precision. Moreover, by arraying the respective scale marks of the θ1 calipers and the θ2 calipers in the X direction as in the above, it is possible to minimize the occupying area of the alignment marks as a whole by reducing the lengths in the Y direction of the θ1 calipers and the θ2 calipers to deal with high integration of the semiconductor device. Besides, since the θ1 calipers and the θ2 calipers are arranged side by side, it is possible to make comparative observation of the misalignments in the θ1 direction and the θ2 direction, which contributes to the improvement of the operational efficiency of the observation.

In the embodiments described in the above, cases in which the θ1 direction and the θ2 direction are making angles of 45° with the X direction and the Y direction, but this invention is equally applicable to the cases of angles other than this value, for example, the cases of angles of 30° and 60° with the X direction. In addition, the scale marks of the respective calipers may be arranged parallel to the Y direction. Moreover, the scale marks of the X calipers may be arranged on a line along the Y direction and the scale marks of the Y calipers may be arranged on a line along the X direction, as the case may be, making it possible to appropriately modify the configuration in conformity with the size and the shape of the available space on the wafer. Furthermore, the pitch and the number of the scale marks of respective calipers are not limited to those described in the embodiments, and can be selected freely.

As described in the above, the alignment marks according to this invention consist of the X calipers for measuring the alignment in the X direction, the Y calipers for measuring the alignment in the Y direction, and the θ calipers for measuring the alignment in the θ direction which makes specific angles with the X direction and the Y direction. Therefore, in addition to making possible ready observations of the misalignments in the X direction and the Y direction by means of an optical microscope, this system makes it possible to quickly measure the misalignment in the θ direction with high precision by a similar observation of the θ calipers. In this way, a highly precise alignment can be made of a semiconductor device for which a severe alignment precision in the θ direction is required, which makes it possible to reduce the design margin for the θ direction and contributes to the improvement in the integration level of the semiconductor device.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. Misregistration detecting marks provided in the periphery of a semiconductor chip comprising: a first scale mark for detecting misalignment in a first direction, a second scale mark for dection misalignment in a second direction perpendicular to said first direction, and a third scale mark for detecting misalignment in a third direction making respectively specified angles with said first direction and said second direction.

2. Misregistration detecting marks as claimed in claim 1, wherein said first scale mark, said second scale mark and said third scale mark are formed in a region within the same visual field of an optical microscope.

3. Misregistration detecting marks as claimed in claim 1, wherein said first scale mark consist of a plurality of lines provided in parallel to said first direction with a specified spacing, said second scale mark consist of a plurality of lines provided in parallel to said second direction with the specified spacing, and said third scale mark consist of a plurality of lines provided in parallel to said third direction with the specific spacing.

4. Misregistration detecting marks as claimed in claim 1, further comprising a fourth scale mark for detecting misalignment in a fourth direction perpendicular to said third direction.

5. Misregistration detecting marks as claimed in claim 1, wherein said first scale mark consist of a plurality of lines provided in parallel to said first direction with a specified spacing, said second scale mark consist of a plurality of lines provided in parallel to said second direction with the specified spacing, and said third scale mark consist of a plurality of lines inclined parallel to said third direction provided in parallel to said first direction with the specified spacing.

6. Misregistration detecting marks as claimed in claim 5, further comprising a fourth scale mark consisting of a plurality of lines inclined in a fourth direction perpendicular to said third direction provided in parallel to said first direction with the specified spacing.

7. Misregistration detecting marks provided in the periphery of a semiconductor chip comprising: a first scale mark consisting of a plurality of first line provided with a first spacing in parallel to a first direction, a second scale mark consisting of a plurality of second lines provided with a second spacing in parallel to a second direction perpendicular to said first direction, and a third scale mark consisting of a plurality of third lines provided with a third spacing in parallel to a third direction making specified angles respectively with said first direction and said second direction.

8. Misregistration detecting marks as claimed in claim 7, wherein said first scale mark, said second scale mark and said third scale mark are formed in a region within the same visual field of an optical microscope.

9. Misregistration detecting marks provided in the periphery of a semiconductor chip comprising: a first scale mark consisting of a plurality of first line provided with a first spacing in parallel to a first direction, a second scale mark consisting of a plurality of second lines provided with a second spacing in parallel to a second direction perpendicular to said first direction, a third scale mark consisting of a plurality of third lines inclined to said first direction and said second direction with respectively specified angles provided with a third spacing in parallel to said first direction.

10. Misregistration detecting marks as claimed in claim 9, further comprising a fourth scale mark consisting of a plurality of fourth lines inclined in a fourth direction perpendicular to said third direction provided with a fourth spacing in parallel to said first direction.

* * * * *